(12) United States Patent
Lin et al.

(10) Patent No.: US 6,820,224 B1
(45) Date of Patent: Nov. 16, 2004

(54) METHOD AND SYSTEM FOR INCREASING YIELD IN EMBEDDED MEMORY DEVICES

(75) Inventors: Hung-Mao Lin, San Jose, CA (US); Jyh-Cherng Lin, San Jose, CA (US); Douglas Chen, Santa Clara, CA (US)

(73) Assignee: ProMOS Technologies Inc. (TW)

( * ) Notice: Subject to any disclaimer, the term of this patent is extended or adjusted under 35 U.S.C. 154(b) by 0 days.

(21) Appl. No.: 09/542,174

(22) Filed: Apr. 4, 2000

(51) Int. Cl.[7] .......................... G11C 29/00; G06F 12/00
(52) U.S. Cl. ....................................... 714/710; 711/161
(58) Field of Search .............................. 714/6, 7, 8, 42, 714/54, 710, 711, 723, 766; 711/144, 147, 161; 365/200, 201

(56) References Cited

U.S. PATENT DOCUMENTS 5,402,377 A * 3/1995 Ohhata et al. .............. 365/200
5,838,893 A * 11/1998 Douceur ........................ 714/7
6,408,401 B1 * 6/2002 Bhavsar et al. ................ 714/7

OTHER PUBLICATIONS

R. Torrance et al., "A 33 GB/s 13.4Mb Integrated Graphics Accelerator and Frame Buffer," IEEE International Solid-State Circuits Conference1998;Digest of Technical Papers. 1998 IEEE International , 1998 pp. 340,341,461.*

* cited by examiner

Primary Examiner—Guy J. Lamarre
Assistant Examiner—Matthew C. Dooley
(74) Attorney, Agent, or Firm—Sawyer Law Group LLP

(57) ABSTRACT

Aspects for increasing yield in an embedded memory device are described. With the aspects of the present invention, a cache is provided for a memory unit of an embedded memory device. Attempts to access a failed bit memory location in the memory unit are determined. When a failed memory bit location is being accessed, substitution of a memory location in the cache for the failed bit memory location occurs.

18 Claims, 2 Drawing Sheets

US 6,820,224 B1

METHOD AND SYSTEM FOR INCREASING YIELD IN EMBEDDED MEMORY DEVICES

FIELD OF THE INVENTION

The present invention relates to embedded memory devices, and more particularly to increasing the yield of embedded memory devices.

BACKGROUND OF THE INVENTION

As central processing units for computer systems have undergone constant improvement, computer systems have continued to increase the number of bits they support and their processing speeds. Matching the improvement in other computer system components can be difficult. Included in these components is a semiconductor memory component, such as random access memory (RAM) for the computer system.

Usual attempts to improve the RAM of a computer system involve increases in the amount of RAM in the system. Developers attempt to provide a maximum amount of RAM with minimum area consumption. The decrease in transistor size has allowed greater capacity in RAM circuits. However, area does increase, which causes the percentage of natural good die per wafer to decrease. Thus, the ability to compensate for defective portions of a die becomes more important.

Memory chips typically employ redundancy to supply spare rows/columns of memory cells on the die. The redundant row/columns suitably aid in maintaining higher capacity and compensate for processing defects in the die by replacing defective rows/columns. In order to implement the use of the redundant row/columns, the chip is usually programmed with fuses to select the redundant row/column in place of the defective row/column. However, even the redundant row/columns may be defective.

Embedded memory devices are particularly concerned with maintaining a high yield of usable memory cells/bits. Embedded memory devices are complex semiconductor circuits that contain both a significant amount of memory and logic cells. After memory repair, if the embedded memory device still exhibits bit locations that are stuck at a one or zero level, the entire embedded memory device becomes unusable. A re-mapping of the failed memory bits is sometimes employed, which consolidates the usable memory cells into one continuous memory space. While re-mapping does allow use of the embedded memory device, the usable memory size is reduced, with one entire row or column discarded for only one failed memory bit.

Accordingly, a need exists for a technique of increasing yield in embedded memory devices.

SUMMARY OF THE INVENTION

The present invention meets this need and provides aspects for increasing yield in an embedded memory device. With the aspects of the present invention, a cache is provided for a memory unit of an embedded memory device. Attempts to access a failed bit memory location in the memory unit are determined. When a failed memory bit location is being accessed, substitution of a memory location in the cache for the failed bit memory location occurs.

With the present invention, an efficient approach to increasing embedded memory device yield is provided. The provision of a cache to substitute for failed memory locations in a memory portion of the embedded memory device allows utilization of memory space substantially equivalent to the intended size of the memory portion. In this manner, the number of usable memory bit locations or yield of the memory portion is increased over prior art approaches of memory re-mapping. Further, the ability to maintain utilization of an embedded memory device with failed bit locations increases production yield, since fewer devices would need to be discarded. These and other advantages of the present invention will be more fully understood in a conjunction with the following detailed description and accompanying drawings.

DETAILED DESCRIPTION OF THE INVENTION

The present invention relates to increasing yield in an embedded memory device. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1:
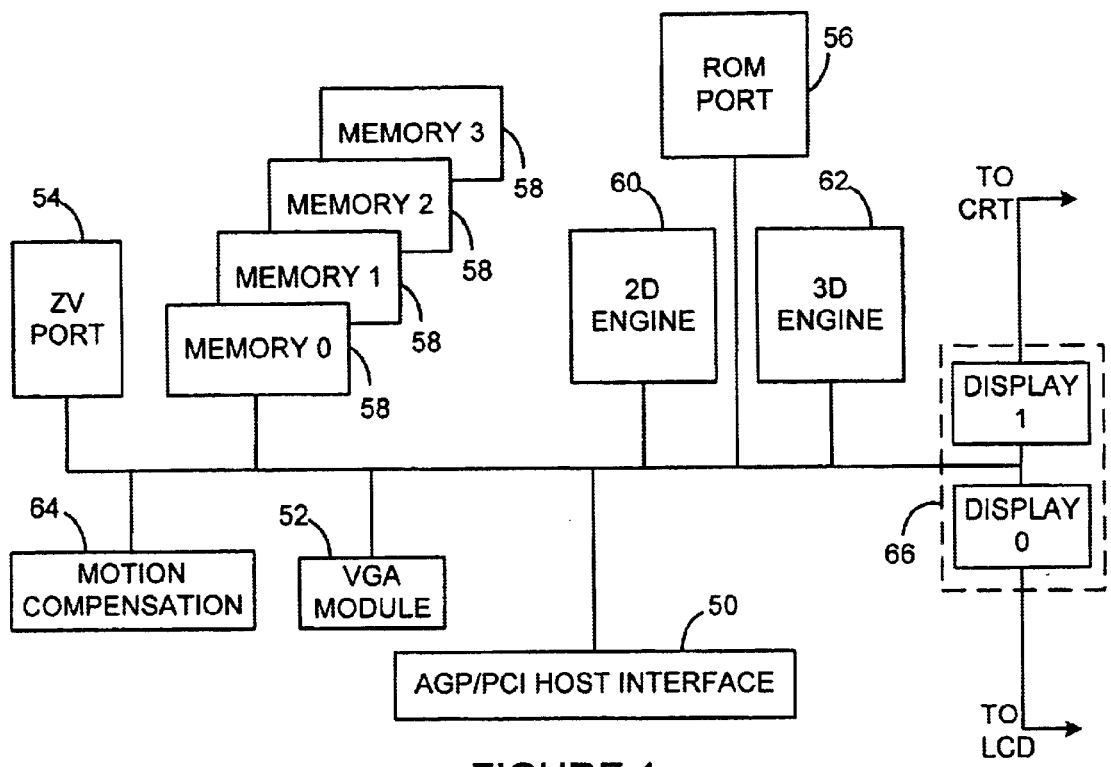
FIG. 1 illustrates an example environment of a graphics accelerator in block diagram form within which embedded memory is utilized.

An internal view of a graphics accelerator is illustrated in block diagram form in FIG. 1. The graphics accelerator of FIG. 1 presents an exemplary device within which embedded memory with increased yield in accordance with the present invention is provided. Of course, the graphics accelerator serves as just one example of a suitable environment for employing the aspects of the present invention. The architecture includes a host interface 50, a standard VGA module 52, a zoom video port 54, a ROM port 56, four modules of high performance embedded memory 58 (e.g., 1 MB (megabyte) DRAM modules) with increased yield in accordance with the present invention, a two-dimensional engine (2D engine) 60, a three-dimensional engine (3D engine) 62, a motion compensation module 64 for accelerating MPEG-2 playback, and dual display circuitry 66 to support single/simultaneous/dual display on any LCD panel/CRT monitor/TV combination.

Figure 2:
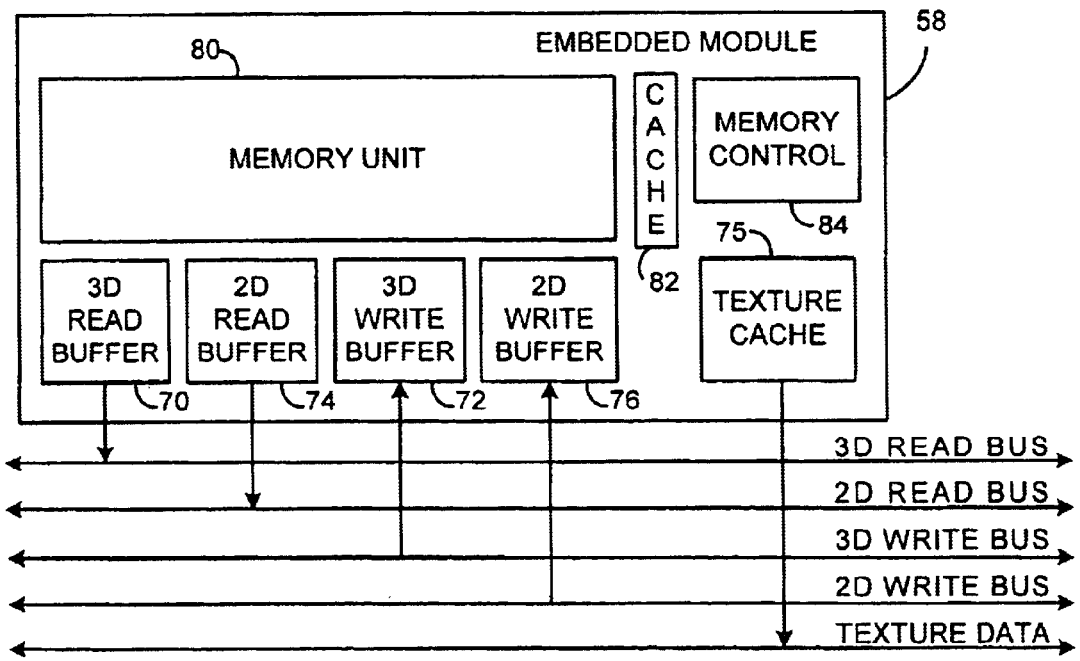
FIG. 2 illustrates the embedded memory of FIG. 1 in greater detail with a cache in accordance with the aspects of the present invention.

One module of the four embedded memory modules 58 is illustrated in more detail in FIG. 2. The module 58 suitably includes read and write buffers for the 2D engine 60 and 3D engine 62, namely 3D read buffer 70, 3D write buffer 72, 2D read buffer 74, and 2D write buffer 76. A texture cache 78 is also included for use with the texture data being processed by the graphics accelerator. The module 58 further includes memory unit 80. In accordance with the present invention, the module 58 includes a bad bit cache 82 that is utilized through the control of a memory control unit 84 to increase yield in the embedded memory module 58, as described in more detail hereinbelow with reference to FIG. 3.

Figure 3:
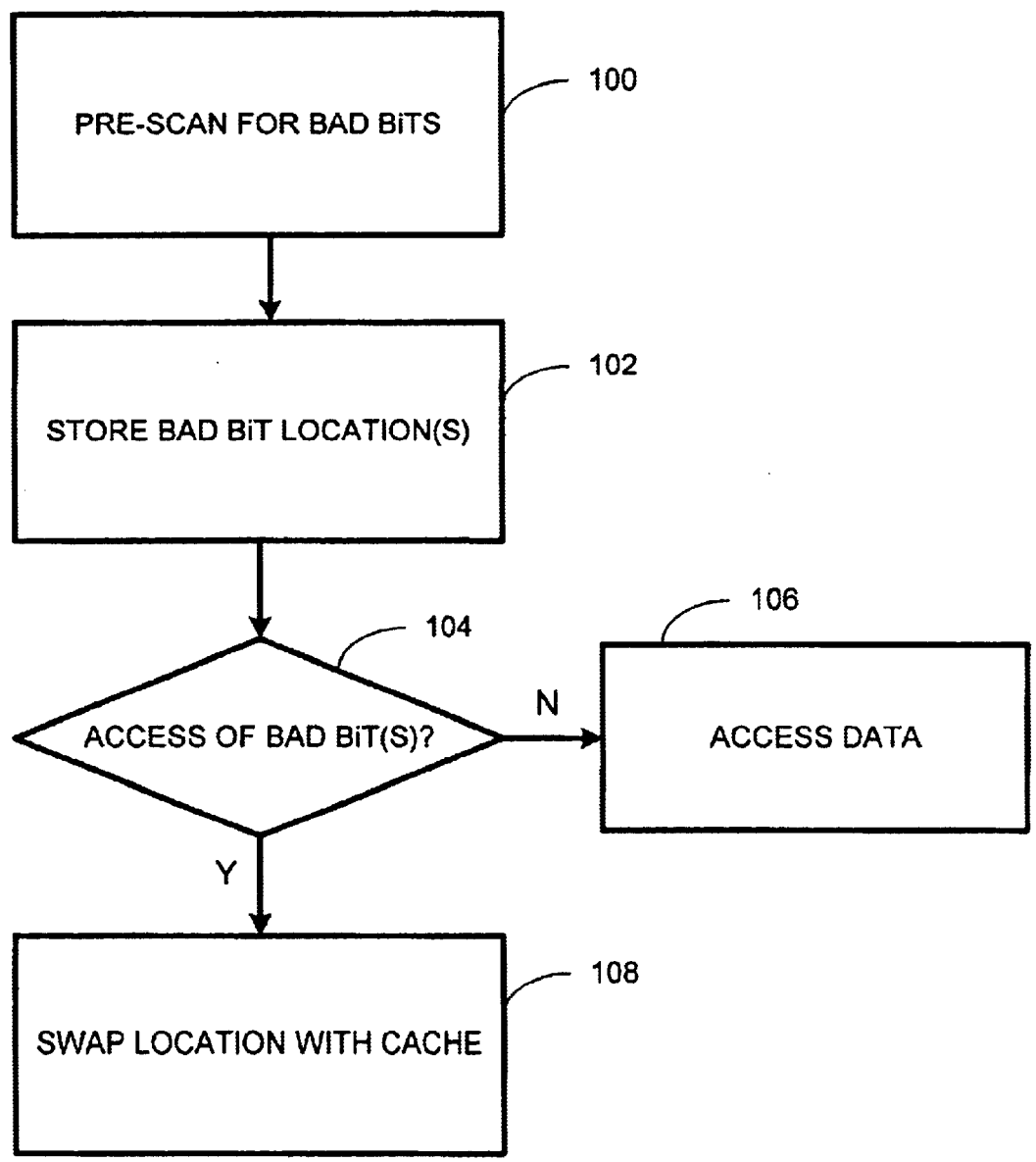
FIG. 3 illustrates a block flow diagram of a method for increasing yield in an embedded memory device in accordance with the present invention.

Referring to FIG. 3, a method for increasing yield in an embedded memory device in accordance with the present invention initiates with a performance of a pre-scan operation to identify bad bit locations in the memory unit 80 (step 100). Pre-scan operations are well-known software support programming that occur each time a system is powered on to locate bad bits for identification in the memory control unit 84. Once located, the bad bit locations are preferably stored in a look-up table in the bad bit cache 82 (step 102). The memory control unit 84 then utilizes the look-up table for comparison when access attempts are made to the memory unit 80 in order to determine whether an access being made is to a bad bit location in the memory unit 80 (step 104). When accessing a non-failed memory location, access occurs as is standard to the memory unit 80 (step 106). However, when an access is being made to a failed memory bit location, the memory control unit 84 substitutes a location in the cache for the failed memory bit location and updates the look-up table to associate the cache location with the failed memory bit location (step 108).

Thus, a small cache, such as an SRAM cache, is successfully utilized to replace the failed memory bit(s) in an embedded memory device. The size of one unit of the cache is determined by design needs and may be as small as one byte/8 bits. By way of example, a 64-byte bad bit cache provides suitable support for a 4 MB embedded memory device. Since a cache is considered to provide a higher yield than that of embedded memory, the yield of the embedded memory device is increased with the use of the cache for failed memory bit locations in the memory unit. Further, the cost of the byte-swap technique of using a cache location for a failed embedded memory location in accordance with the present invention is considered to be lower than the cost of row or column repair in the embedded memory device. The use of byte-swapping also allows utilization of memory space substantially equivalent to the entire size of the memory unit, which results in a higher yield of usable memory for the embedded memory device as compared with embedded memory devices re-mapped to compensate for failed memory bits.

Although the present invention has been described in accordance with the embodiments shown, one of ordinary skill in the art will readily recognize that there could be variations to the embodiments and those variations would be within the spirit and scope of the present invention. Accordingly, many modifications may be made by one or ordinary skill in the art without departing from the spirit and scope of the appended claims.

What is claimed is:

1. A method for increasing yield of usable memory locations in an embedded memory device, the method comprising:

providing a cache for a memory unit;

determining when an access is made to a failed bit memory location in the memory unit, wherein determining when an access is made further comprises identifying each failed bit location in the memory unit and storing each failed bit location in the cache, wherein storing further comprises storing each failed bit location in a look-up table; and substituting a memory location in the cache for the failed bit memory location when the failed memory bit location is accessed.

2. The method of claim 1 wherein determining further comprises comparing a memory location being accessed to identified failed bit locations.

3. The method of claim 1 wherein identifying each failed bit location further comprises performing a pre-scan operation on the memory unit.

4. The method of claim 1 wherein providing a cache further comprises providing an SRAM.

5. The method of claim 1 wherein the memory unit further comprises a DRAM unit.

6. A method for increasing yield of usable memory locations in an embedded memory device, the method comprising:

performing a memory pre-scan operation on an embedded memory device to identify each failed bit location in the embedded memory device;

storing each failed bit location in a look-up table; and swapping a memory location within a cache for a failed bit location.

7. The method of claim 6 further comprising providing the cache between a memory unit and a memory control unit in the embedded memory device.

8. The method of claim 6 further comprising storing each failed bit location in a look-up table in the cache.

9. The method of claim 6 wherein swapping a memory location further comprises swapping when an access attempt is made to a failed bit location.

10. The method of claim 9 further comprising swapping by a memory control unit for the embedded memory device.

11. The method of claim 6 wherein the memory unit further comprises a DRAM unit.

12. The method of claim 6 wherein the cache further comprises an SRAM unit.

13. An embedded memory device with increased yield of usable memory locations, the embedded memory device comprising:

a memory unit;

a cache coupled to the memory unit; and a memory control unit coupled to the memory unit and the cache, the memory control unit determining when an access is made to a failed bit memory location in the memory unit, and substituting a memory location in the cache for the failed bit memory location when the failed memory bit location is accessed, wherein determining when an access is made further comprises identifying each failed bit location in the memory unit and storing each failed bit location in the cache, wherein storing further comprises storing each failed bit location in a look-up table.

14. The embedded memory device of claim 13 wherein the memory unit further comprises a DRAM.

15. The embedded memory device of claim 13 wherein the cache further comprises an SRAM.

16. The embedded memory device of claim 13 wherein the memory control unit further identifies each failed bit location in the memory unit and stores each failed bit location in the cache.

17. The embedded memory device of claim 16 wherein the memory control unit further compares a memory location being accessed to the identified failed bit locations.

18. The embedded memory device of claim 13 further comprising an embedded memory of a graphics accelerator.

* * * * *